United States Patent
Liu et al.

(10) Patent No.: US 10,147,814 B2
(45) Date of Patent: Dec. 4, 2018

(54) LATERAL MOSFET

(71) Applicant: Taiwan Semiconductor Manufacturing Company, Ltd., Hsinchu (TW)

(72) Inventors: Huei-Ru Liu, Luzhu Township (TW); Chien-Chih Chou, New Taipei (TW); Kong-Beng Thei, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/624,280

(22) Filed: Jun. 15, 2017

(65) Prior Publication Data

US 2017/0288054 A1 Oct. 5, 2017

Related U.S. Application Data

(60) Continuation of application No. 15/174,305, filed on Jun. 6, 2016, now Pat. No. 9,691,895, which is a (Continued)

(51) Int. Cl.
*H01L 29/78* (2006.01)
*H01L 27/088* (2006.01)
(Continued)

(52) U.S. Cl.
CPC .... *H01L 29/7823* (2013.01); *H01L 21/26513* (2013.01); *H01L 21/28185* (2013.01); *H01L 21/31111* (2013.01); *H01L 21/32133* (2013.01); *H01L 21/76224* (2013.01); *H01L 21/823418* (2013.01); *H01L 21/823437* (2013.01); *H01L 21/823462* (2013.01);
(Continued)

(58) Field of Classification Search
CPC ........... H01L 29/7823; H01L 21/76224; H01L 21/823462; H01L 21/823481; H01L 29/0611; H01L 29/0852; H01L 29/66681; H01L 21/28185; H01L 21/31111; H01L 21/32133; H01L 21/26513; H01L 21/823418; H01L 21/823437; H01L 29/42368; H01L 29/402; H01L 29/1083; H01L 29/0653; H01L 29/66659; H01L 29/4236; H01L 29/7835; H01L 27/088
See application file for complete search history.

(56) References Cited

U.S. PATENT DOCUMENTS

| 5,291,439 | A | 3/1994 | Kauffmann et al. |
| 5,293,331 | A | 3/1994 | Hart et al. |

(Continued)

*Primary Examiner* — Bac Au
(74) *Attorney, Agent, or Firm* — Slater Matsil, LLP

(57) ABSTRACT

A method includes forming a first isolation region in a substrate, wherein a top surface of the first isolation region is level with a top surface of the substrate, removing an upper portion of the first isolation region to form a recess, depositing a gate dielectric layer over the first isolation region, forming a gate electrode layer over the gate dielectric layer and patterning the gate electrode layer to form a gate electrode region, wherein a first portion of the gate electrode region is vertically aligned with the first isolation region and a second portion of the gate electrode region is formed over the substrate, and where a top surface of the first portion is lower than a top surface of the second portion.

20 Claims, 16 Drawing Sheets

Related U.S. Application Data division of application No. 13/666,632, filed on Nov. 1, 2012, now Pat. No. 9,362,272.

(51) Int. Cl.

| | |
|---|---|
| *H01L 29/423* | (2006.01) |
| *H01L 29/66* | (2006.01) |
| *H01L 29/06* | (2006.01) |
| *H01L 29/10* | (2006.01) |
| *H01L 29/40* | (2006.01) |
| *H01L 21/265* | (2006.01) |
| *H01L 21/28* | (2006.01) |
| *H01L 21/311* | (2006.01) |
| *H01L 21/3213* | (2006.01) |
| *H01L 21/762* | (2006.01) |
| *H01L 21/8234* | (2006.01) |
| *H01L 29/08* | (2006.01) |

(52) U.S. Cl.
CPC .... *H01L 21/823481* (2013.01); *H01L 27/088* (2013.01); *H01L 29/0611* (2013.01); *H01L 29/0653* (2013.01); *H01L 29/0852* (2013.01); *H01L 29/1083* (2013.01); *H01L 29/402* (2013.01); *H01L 29/4236* (2013.01); *H01L 29/42368* (2013.01); *H01L 29/66659* (2013.01); *H01L 29/66681* (2013.01); *H01L 29/7835* (2013.01)

(56) References Cited

U.S. PATENT DOCUMENTS

| | | | |
|---|---|---|---|
| 5,404,037 A | 4/1995 | Manley | |
| 5,514,607 A | 5/1996 | Taneda | |
| 5,731,237 A | 3/1998 | Sato | |
| 6,084,271 A | 7/2000 | Yu et al. | |
| 6,121,086 A | 9/2000 | Kuroda et al. | |
| 6,194,702 B1 | 2/2001 | Hook et al. | |
| 6,242,298 B1 | 6/2001 | Kawakubo | |
| 6,246,094 B1 | 6/2001 | Wong et al. | |
| 6,380,019 B1 | 4/2002 | Yu et al. | |
| 6,444,554 B1 | 9/2002 | Adachi et al. | |
| 6,531,366 B1 | 3/2003 | Kouznetsov | |
| 6,613,690 B1 | 9/2003 | Chang et al. | |
| 6,653,682 B1 | 11/2003 | Houdt et al. | |
| 6,806,530 B2 | 10/2004 | Kim | |
| 6,884,682 B2 | 4/2005 | Lee | |
| 7,038,268 B2 | 5/2006 | Kinoshita et al. | |
| 7,119,412 B2 | 10/2006 | Yamamoto | |
| 7,557,004 B2 | 7/2009 | Ogawa et al. | |
| 7,807,546 B2 | 10/2010 | Lee et al. | |
| 7,816,726 B2 | 10/2010 | He et al. | |
| 7,939,893 B2 | 5/2011 | Ema et al. | |
| 7,951,686 B2 | 5/2011 | Kishii et al. | |
| 8,102,007 B1 | 1/2012 | Hyde et al. | |
| 8,329,545 B1 | 12/2012 | Meotto et al. | |
| 8,368,161 B2 | 2/2013 | Koga et al. | |
| 9,099,334 B2* | 8/2015 | Ishii | H01L 21/82 |
| 9,184,053 B2* | 11/2015 | Shinohara | H01L 21/02697 |
| 2005/0104118 A1 | 5/2005 | Diorio et al. | |
| 2005/0151180 A1 | 7/2005 | Chiang | |
| 2005/0227440 A1 | 10/2005 | Ema et al. | |
| 2006/0001108 A1 | 1/2006 | Yamamoto | |
| 2006/0006462 A1 | 1/2006 | Chang et al. | |
| 2006/0008976 A1 | 1/2006 | Tu | |
| 2006/0172504 A1 | 8/2006 | Sinitsky et al. | |
| 2008/0128819 A1 | 6/2008 | Bang | |
| 2009/0096036 A1 | 4/2009 | Ishigaki et al. | |
| 2009/0159938 A1 | 6/2009 | Nuttinck et al. | |
| 2010/0025761 A1 | 2/2010 | Voldman | |
| 2010/0044790 A1 | 2/2010 | Kato et al. | |
| 2011/0292964 A1 | 12/2011 | Kashyap et al. | |
| 2012/0058628 A1 | 3/2012 | Lai et al. | |
| 2012/0292688 A1 | 11/2012 | Kwon | |
| 2012/0301989 A1 | 11/2012 | Hashimoto et al. | |
| 2013/0270634 A1 | 10/2013 | Huang et al. | |
| 2014/0117454 A1 | 5/2014 | Liu et al. | |

\* cited by examiner

LATERAL MOSFET

PRIORITY CLAIM AND CROSS-REFERENCE

This application is a continuation of U.S. patent application Ser. No. 15/174,305, entitled "Lateral MOSFET", filed on Jun. 6, 2016, which is a divisional of U.S. patent application Ser. No. 13/666,632, entitled "Lateral MOSFET," filed on Nov. 1, 2012, now U.S. Pat. No. 9,362,272, issued on Jun. 7, 2016, which applications are incorporated herein by reference in their entirety.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are needed to maintain the electronic components' performance from one generation to the next. For example, low on-resistance and high breakdown voltage of transistors are desirable for various high power applications.

As semiconductor technologies evolve, metal oxide semiconductor field effect transistors (MOSFET) have been widely used in today's integrated circuits. MOSFETs are voltage controlled devices. When a control voltage is applied to the gate of a MOSFET and the control voltage is greater than the threshold of the MOSFET, a conductive channel is established between the drain and the source of the MOSFET. As a result, a current flows between the drain and the source of the MOSFET. On the other hand, when the control voltage is less than the threshold of the MOSFET, the MOSFET is turned off accordingly.

According to the polarity difference, MOSFETs may include two major categories. One is n-channel MOSFETs; the other is p-channel MOSFETs. On the other hand, according to the structure difference, MOSFETs can be further divided into three sub-categories, planar MOSFETs, lateral diffused MOS (LDMOS) FETs and vertical diffused MOSFETs.

In comparison with other MOSFETs, the LDMOS transistor has more advantages. For example, the LDMOS transistor is capable of delivering more current per unit area because its asymmetric structure provides a short channel between the drain and the source of the LDMOS transistor.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a lateral metal oxide semiconductor field effect transistor (MOSFET). The embodiments of the disclosure may also be applied, however, to a variety of metal oxide semiconductor transistors. Hereinafter, various embodiments will be explained in detail with reference to the accompanying drawings.

Figure 1:
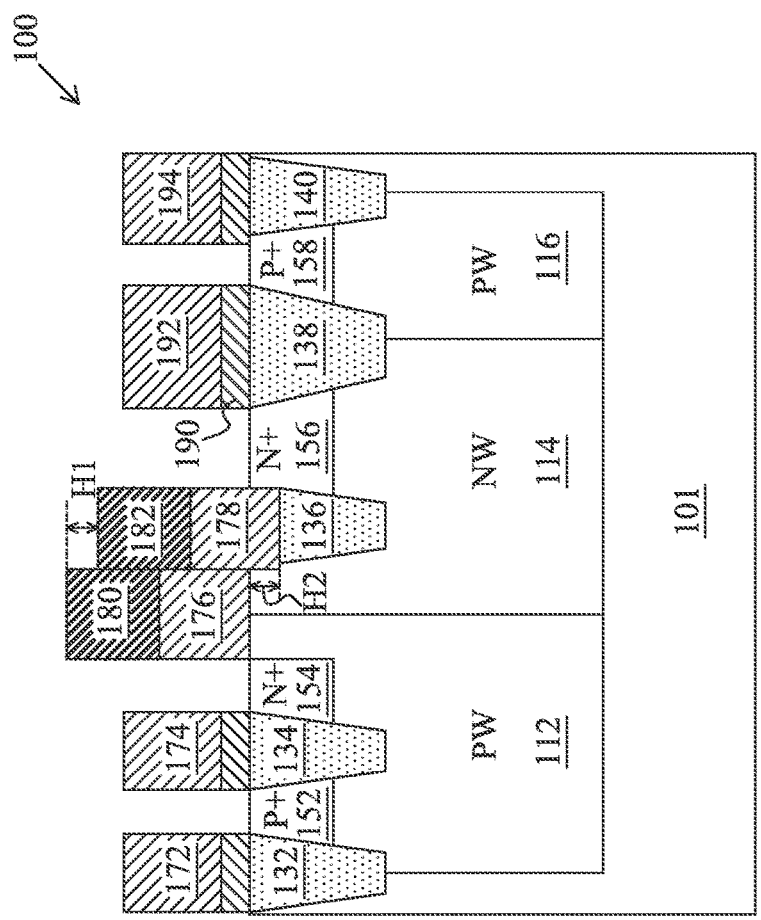
FIG. 1 illustrates a cross sectional view of a semiconductor device including a lateral diffusion metal oxide semiconductor (LDMOS) transistor in accordance with an embodiment.

FIG. 1 illustrates a cross sectional view of a semiconductor device including a lateral diffused metal oxide semiconductor (LDMOS) transistor in accordance with an embodiment. The LDMOS transistor 100 is formed in a substrate 101. In accordance with an embodiment, the substrate 101 may be formed of silicon, silicon germanium, silicon carbide or the like.

As shown in FIG. 1, there may be three wells formed in the substrate 101. The wells are a first p-type well 112, a first n-type well 114 and a second p-type well 116. In particular, the first n-type well 114 is disposed between the first p-type well 112 and the second p-type well 116.

The first p-type well 112 and the second p-type well 116 are formed by implanting p-type doping materials such as boron, gallium, aluminum, indium, combinations thereof, or the like. In accordance with an embodiment, a p-type material such as boron may be implanted to a doping density of about $10^{15}/cm^3$ to $10^{18}/cm^3$. Alternatively, the first p-type well 112 and the second p-type well 116 can be formed by a diffusion process.

Likewise, the first n-type well 114 are formed by implanting n-type doping materials such as phosphorus, arsenic, or the like. In accordance with an embodiment, an n-type material such as phosphorus may be implanted to a doping density of about $10^{15}/cm^3$ to $10^{18}/cm^3$. Alternatively, the first n-type well 114 can be formed by a diffusion process.

As shown in FIG. 1, there may be a plurality of isolation regions and active regions formed in the substrate 101. The active regions include a first P+ region 152, a first drain/source region 154, a second drain/source region 156 and a second P+ region 158. The drain/source regions as well as the P+ regions may form a LDMOS transistor.

In accordance with an embodiment, the wells (e.g., p-type wells 112, 116 and n-type well 116) shown in FIG. 1 are high voltage wells. As a result, the LDMOS transistor 100 is a high voltage transistor. Such a high voltage transistor can be used in medium voltage applications having a voltage rating range from about 2V to about 8V. Alternatively, such a high voltage transistor can be sued in high voltage applications in a range from about 8V to about 400V. Furthermore, such a high voltage transistor may be used in ultra-high voltage applications having a voltage rating greater than 400V.

The isolation regions shown in FIG. 1 provide isolation between active regions. For example, the isolation region 132 is formed at an interface in the substrate 101 between the first n-type well 112 and an exterior well or component. The isolation region 134 is employed to isolate active regions (e.g., the first P+ region 152 and the first drain/source region 154) so as to prevent leakage current from flowing between adjacent active regions.

The isolation region 136 functions as a reduced surface field (RESURF) structure. More particularly, the isolation region 136 is an extension of the second drain/source region 156. Such a dielectric extension of the second drain/source region 156 helps to achieve a uniform electric field distribution. As a result, the LDMOS transistor 100 may achieve both higher breakdown voltage and lower on resistance.

It should be noted that a top surface of the isolation region 138 is lower than the top surfaces of other isolation regions (e.g., isolation regions 132 and 134). The gap between the top surface of the isolation region 136 and the top surface of the substrate 101 is filled with a gate dielectric material. The height of the gap is defined as H2 as shown in FIG. 1. The detailed formation process of the gap between the top surface of the isolation region 136 and the top surface of the substrate 101 will be described below with respect to FIG. 5.

The isolation region 138 is formed between the second drain/source region 156 and the second P+ region 158. The isolation region 140 is formed adjacent to the second P+ region 158. The function and structure of the isolation regions 138 and 140 are similar to the function and structure of isolation regions 134 and 132 respectively, and hence are not discussed in detail herein to avoid unnecessary repetition.

The isolation regions (e.g., isolation regions 132, 134, 136, 138 and 140) can be formed by various suitable fabrication techniques (e.g., thermally grown, deposited) and a variety of materials (e.g., silicon oxide, silicon nitride, any combinations thereof and/or the like). In this embodiment, the isolation region 104 may be fabricated by using a shallow trench isolation (STI) technique.

A gate dielectric layer is deposited over the substrate 101. In order to form active regions through ion implantation techniques, there may be a plurality of openings formed between two adjacent gate dielectric blocks. For example, in order to form the first P+ region 152, there is an opening between a first gate dielectric block 172 and a second gate dielectric block 174. The detailed process of forming openings in the gate dielectric layer will be described below with respect to FIGS. 14-16.

A gate electrode layer is formed over the substrate 101. As shown in FIG. 1, the gate electrode layer may be divided into two portions, namely a first gate electrode layer 180 and a second gate electrode layer 182. As shown in FIG. 1, the first gate electrode layer 180 is formed over a first gate dielectric region 176, which is formed on the top surface of the substrate 101. The second gate electrode layer 182 is vertically aligned with the isolation region 136. More particularly, due to the gap between the isolation region 136 and the top surface of the substrate 101, there is a height difference between the top surface of the first gate electrode layer 180 and the top surface of the second gate electrode layer 182. The height difference shown in FIG. 1 is defined as H1. In accordance with an embodiment, H1 is in a range from about 300 Angstroms to about 500 Angstroms.

One skilled in the art will recognize that FIG. 1 illustrates an ideal profile. H1 and H2 may vary after subsequent fabrication processes. The height difference (e.g., H1 and H2) shown in FIG. 1 is used to illustrate the inventive aspects of the various embodiments. The disclosure is not limited to any particular height difference.

It should be noted that the height of the first gate electrode layer 180 is similar to the height of conventional LDMOS transistors' gate electrode layer. Without having a recess at the isolation region 136, the top surface of the second gate electrode layer 182 may be higher than the top surface of conventional LDMOS transistors' gate electrode layer. The protruded second electrode layer 182 may lead to a short between the second electrode layer 182 and subsequently formed metal layers (e.g., a first metal layer M1).

One advantageous feature of having the second gate electrode layer 182 with a lower top surface is that the lower top surface of the second gate electrode 182 helps to prevent the second gate electrode layer 182 from shorting with subsequently formed metal layers (e.g., a first metal layer M1). As a result, the process margin of the LDMOS transistor 100 can be improved. The improved process margin may further simplify the fabrication process and reduce the manufacturing cost of the LDMOS transistor 100.

Figure 2:
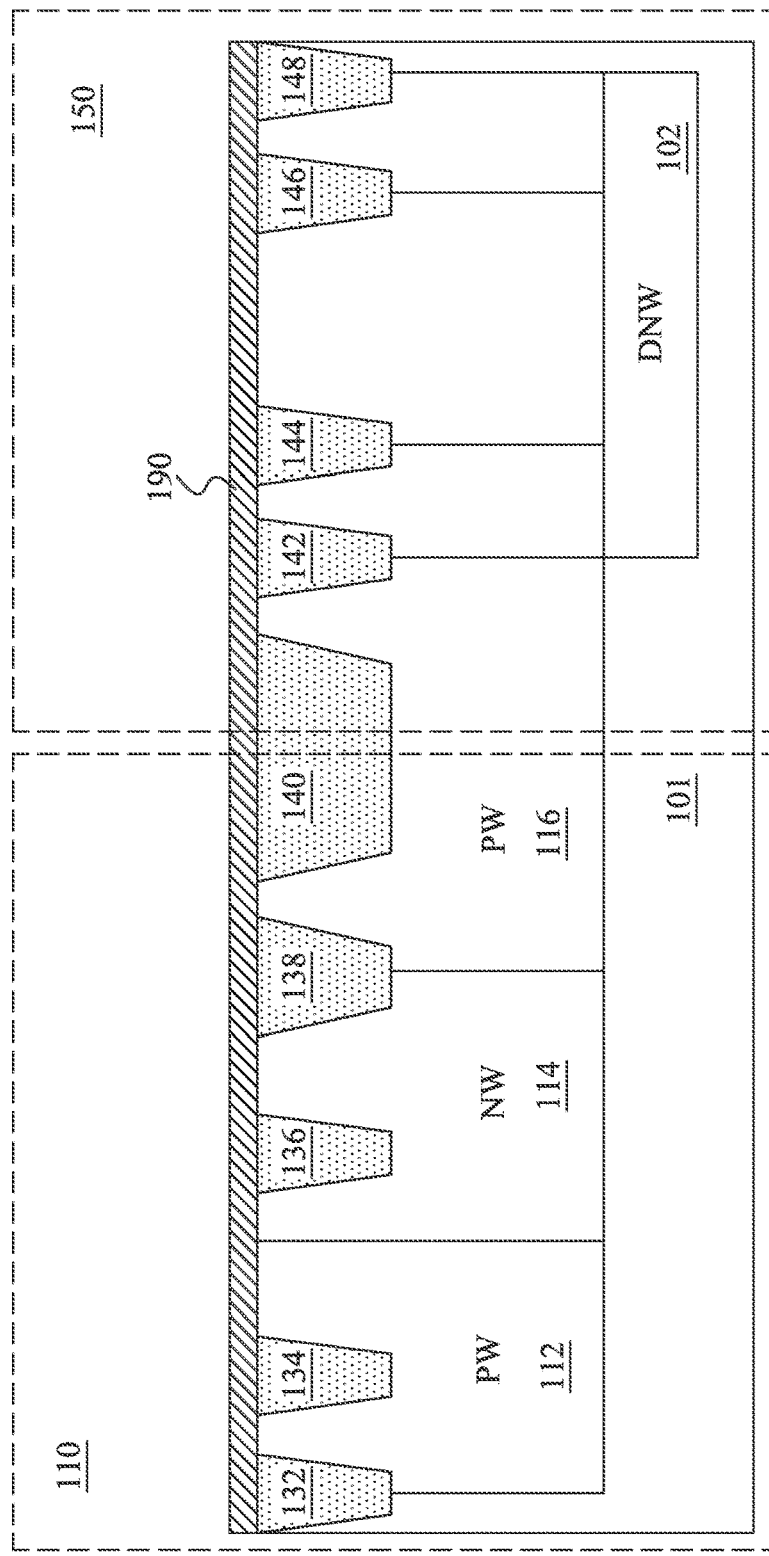
FIG. 2 illustrates a cross sectional view of a semiconductor device after a dielectric layer is deposited over the substrate in accordance with an embodiment.

FIGS. 2-16 illustrates cross sectional views of intermediate steps of fabricating a semiconductor device including the LDMOS transistor shown in FIG. 1 in accordance with an embodiment. FIG. 2 illustrates a cross sectional view of a semiconductor device after a dielectric layer is deposited over the substrate 101 in accordance with an embodiment. The substrate 101 can be a semiconductor substrate, such as a bulk silicon substrate, a semiconductor on insulator (SOI), or the like.

The substrate 101 may include two regions, namely a high voltage region 110 and a low voltage region 150. The high voltage region 110 and the low voltage region 150 are demarcated in this example by two dashed rectangles. The substrate 101 can be doped with various wells, such as according to appropriate high voltage and low voltage applications. In the high voltage region 110, a first p-type well 112, a first n-type well 114 and a second p-type well 116 are formed in the substrate 101.

The high voltage region 110 is used to form a high voltage LDMOS transistor. Likewise, the low voltage region 150 is used to form a low voltage planar transistor. The detailed formation process of the high voltage LDMOS transistor and low voltage planar transistor will be described below with respect to FIGS. 3-16.

As shown in FIG. 2, a dielectric layer 190 is formed over the substrate 101. The dielectric layer 190 may be formed of various dielectric materials commonly used in integrated circuit fabrication. For example, the dielectric layer 190 may be formed of silicon dioxide, silicon nitride or a doped glass layer such as boron silicate glass and the like. Alternatively, dielectric layer may be a silicon oxynitride layer, a polyamide layer, a low dielectric constant insulator and/or the like. In addition, a combination of the foregoing dielectric materials may also be used to form the dielectric layer 190.

In accordance with an embodiment, the dielectric layer 190 may be formed of silicon nitride. The silicon nitride layer 190 may be formed using suitable deposition techniques such as chemical vapor deposition (CVD) and/or the like.

Figure 3:
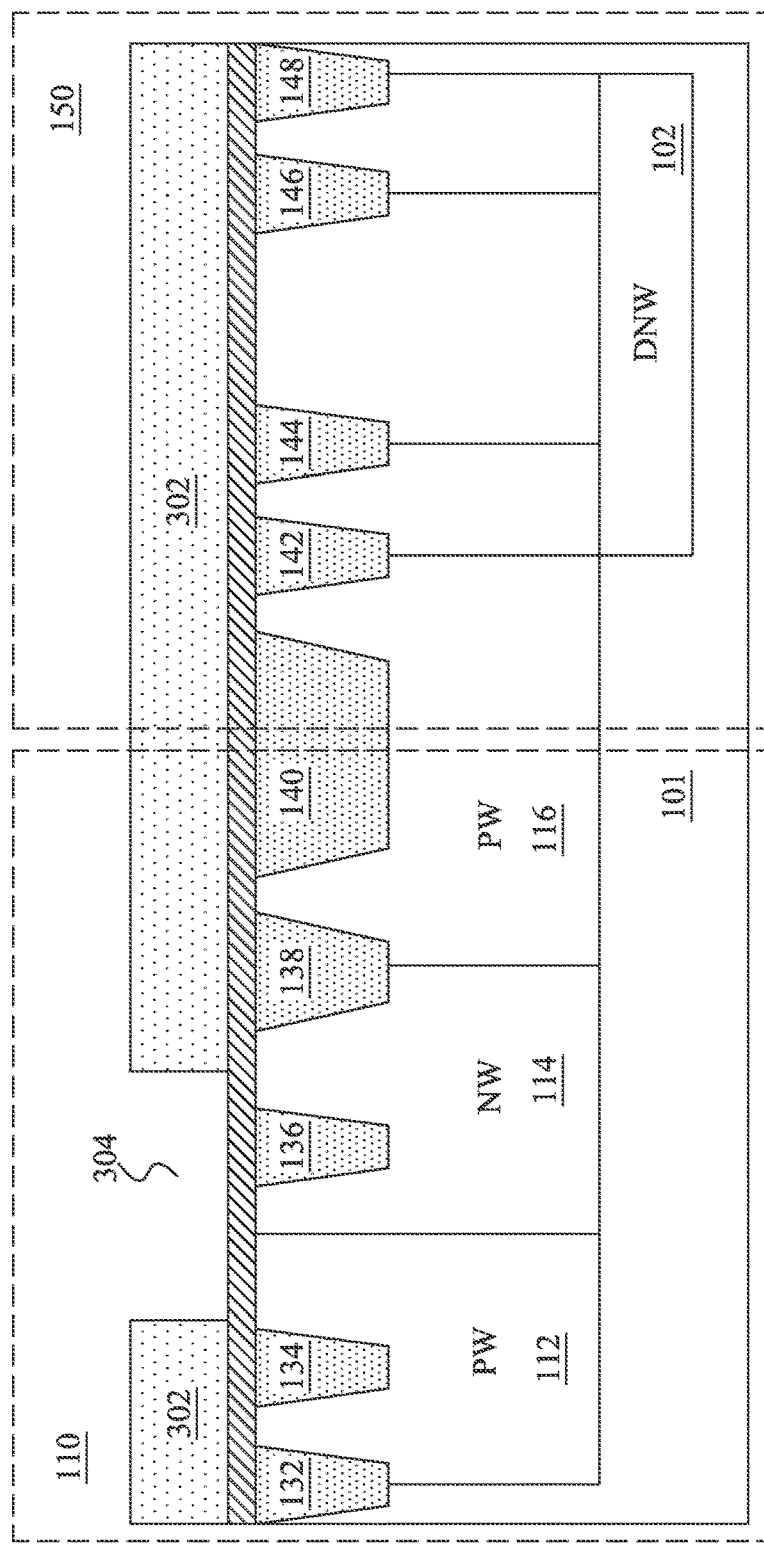
FIG. 3 illustrates a cross sectional view of the semiconductor device shown in FIG. 2 after a patterning process is applied to the semiconductor device in accordance with an embodiment.

FIG. 3 illustrates a cross sectional view of the semiconductor device shown in FIG. 2 after a patterning process is applied to the semiconductor device in accordance with an embodiment. In accordance with an embodiment, a photoresist mask layer 302 is deposited over the dielectric layer 190 through suitable deposition techniques. Furthermore, in consideration with the location of the opening in the dielectric layer 190, suitable photolithography techniques are employed to form an opening 304 in the photoresist layer 302.

Figure 4:
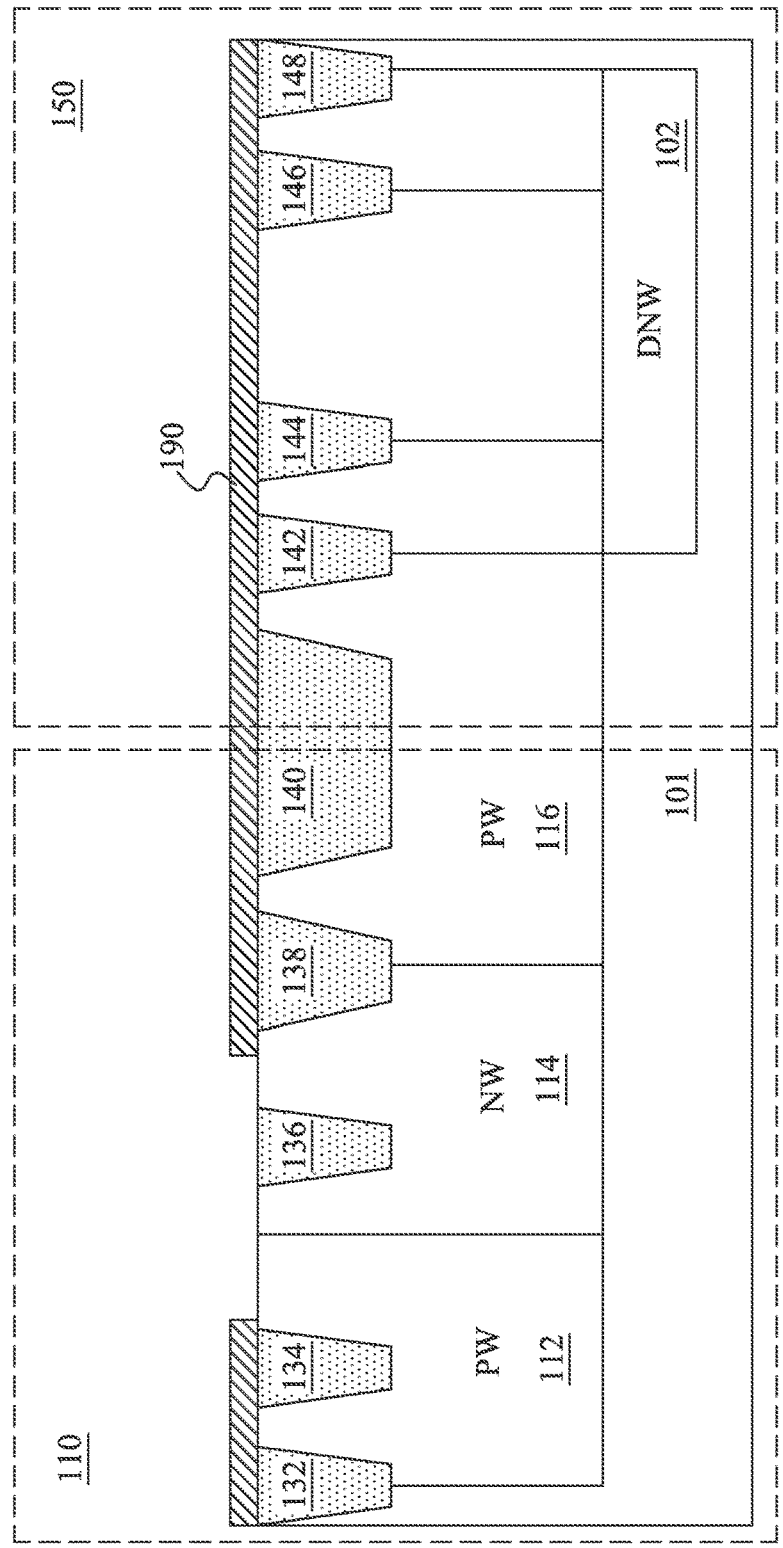
FIG. 4 illustrates a cross sectional view of the semiconductor device shown in FIG. 3 after an etching process is applied to the semiconductor device in accordance with an embodiment.
Figure 5:
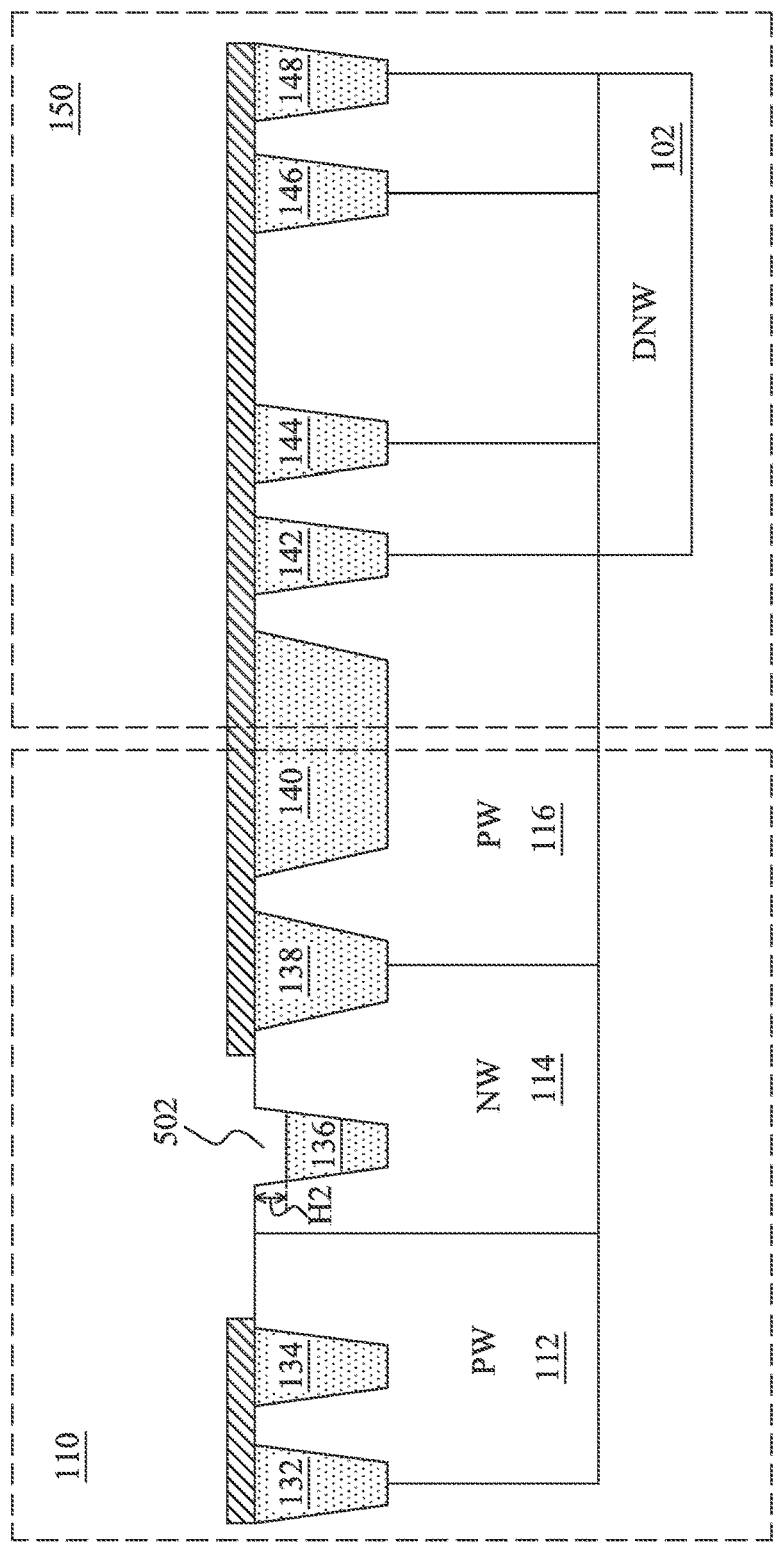
FIG. 5 illustrates a cross sectional view of the semiconductor device shown in FIG. 4 after an etching process is applied to an isolation region of the semiconductor device in accordance with an embodiment.

FIG. 4 and FIG. 5 illustrate a high voltage gate oxide pre-clean process in accordance with an embodiment. FIG. 4 illustrates a cross sectional view of the semiconductor device shown in FIG. 3 after an etching process is applied to the semiconductor device in accordance with an embodiment. An etching process, such as a reactive ion etch (RIE) or other dry etch, an anisotropic wet etch, or any other suitable anisotropic etch or patterning process, is performed to remove a portion of the dielectric layer 190. The remaining photo resist layer (not shown) may be removed by using a suitable ashing process.

FIG. 5 illustrates a cross sectional view of the semiconductor device shown in FIG. 4 after an etching process is applied to an isolation region of the semiconductor device in accordance with an embodiment. A suitable etching technique such as a wet etching technique is applied to the upper portion of the isolation region 136. As a result, the dielectric material filled in the upper portion of the isolation region 136 has been removed. By controlling the strength and direction of the etching process, a recess 502 is formed in the isolation region 136. In accordance with an embodiment, the recess 502 is of a height H2. H2 is in a range from about 300 Angstroms to about 500 Angstroms.

Figure 6:
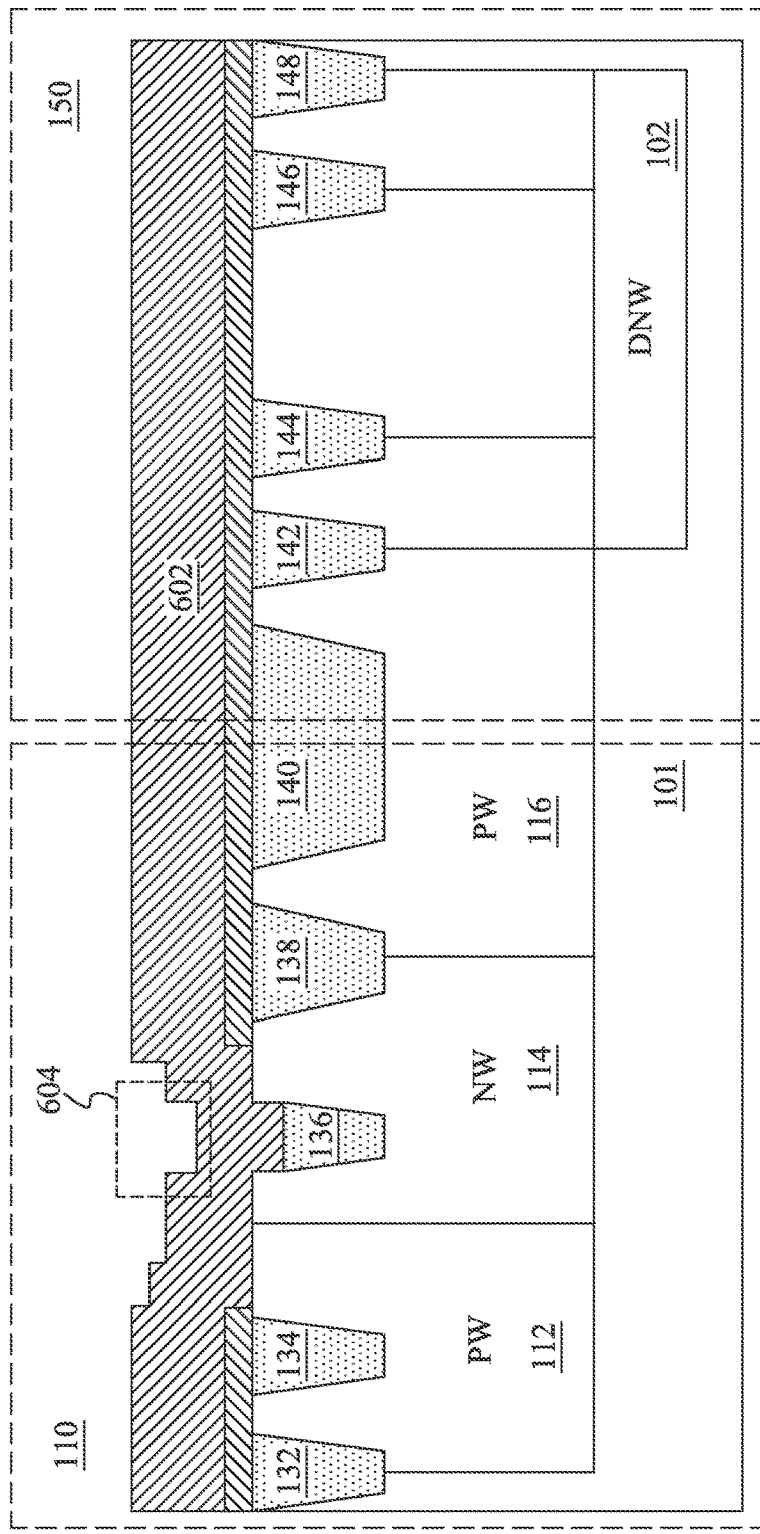
FIG. 6 illustrates a cross sectional view of the semiconductor device shown in FIG. 5 after a high voltage gate dielectric layer is deposited over the substrate in accordance with an embodiment.

FIG. 6 illustrates a cross sectional view of the semiconductor device shown in FIG. 5 after a high voltage gate dielectric layer is deposited over the substrate in accordance with an embodiment. The high voltage gate dielectric layer 602 is conformally deposited over the substrate 101. The high voltage gate dielectric layer 602 may be formed by using suitable deposition techniques such as CVD and/or the like.

In accordance with various embodiments, the high voltage gate dielectric layer 602 may be formed of an oxide, such as silicon oxide, silicon nitride, composite oxide/nitride/oxide, the like, or a combination thereof. Other acceptable materials can be used for the high voltage gate dielectric layer 602. The thickness of the high voltage gate dielectric layer 602 is in a range from about 250 Å to about 4,000 Å.

It should be noted that the high voltage gate dielectric layer 602 is of an uneven surface (e.g., the region highlighted by a dashed rectangle 604) due to the recess 502 (shown in FIG. 5) in the isolation region 136. It should further be noted that the high voltage dielectric layer 602 may be of a multiple layer structure. Alternatively, the high voltage dielectric layer 602 may comprise different dielectric materials.

Figure 7:
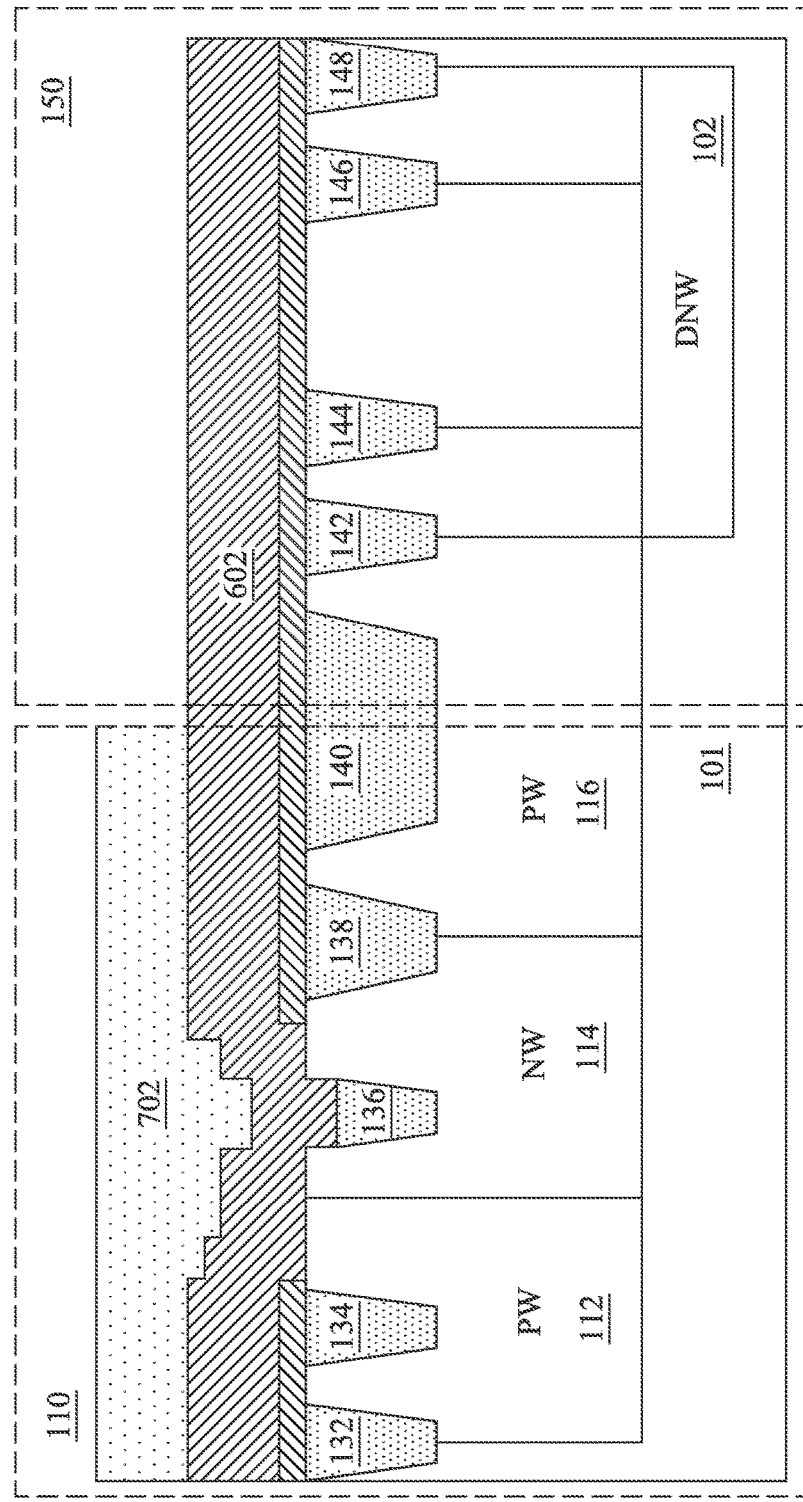
FIG. 7 illustrates a cross sectional view of the semiconductor device shown in FIG. 6 after a photoresist layer is deposited over the high voltage dielectric layer in accordance with an embodiment.

FIG. 7 illustrates a cross sectional view of the semiconductor device shown in FIG. 6 after a photoresist layer is deposited over the high voltage dielectric layer in accordance with an embodiment. A photoresist layer 702 is deposited over the high voltage gate dielectric layer 602 using a spin on deposition and/or the like. The photoresist layer 702 is exposed and developed such that only the portion over the high voltage region 110 remains. The remaining photoresist layer 702 laterally extends from the isolation region 132 to the isolation region 140. The portion of the high voltage gate dielectric layer 602 over the low voltage region 150 is exposed by the photoresist layer 702.

Figure 8:
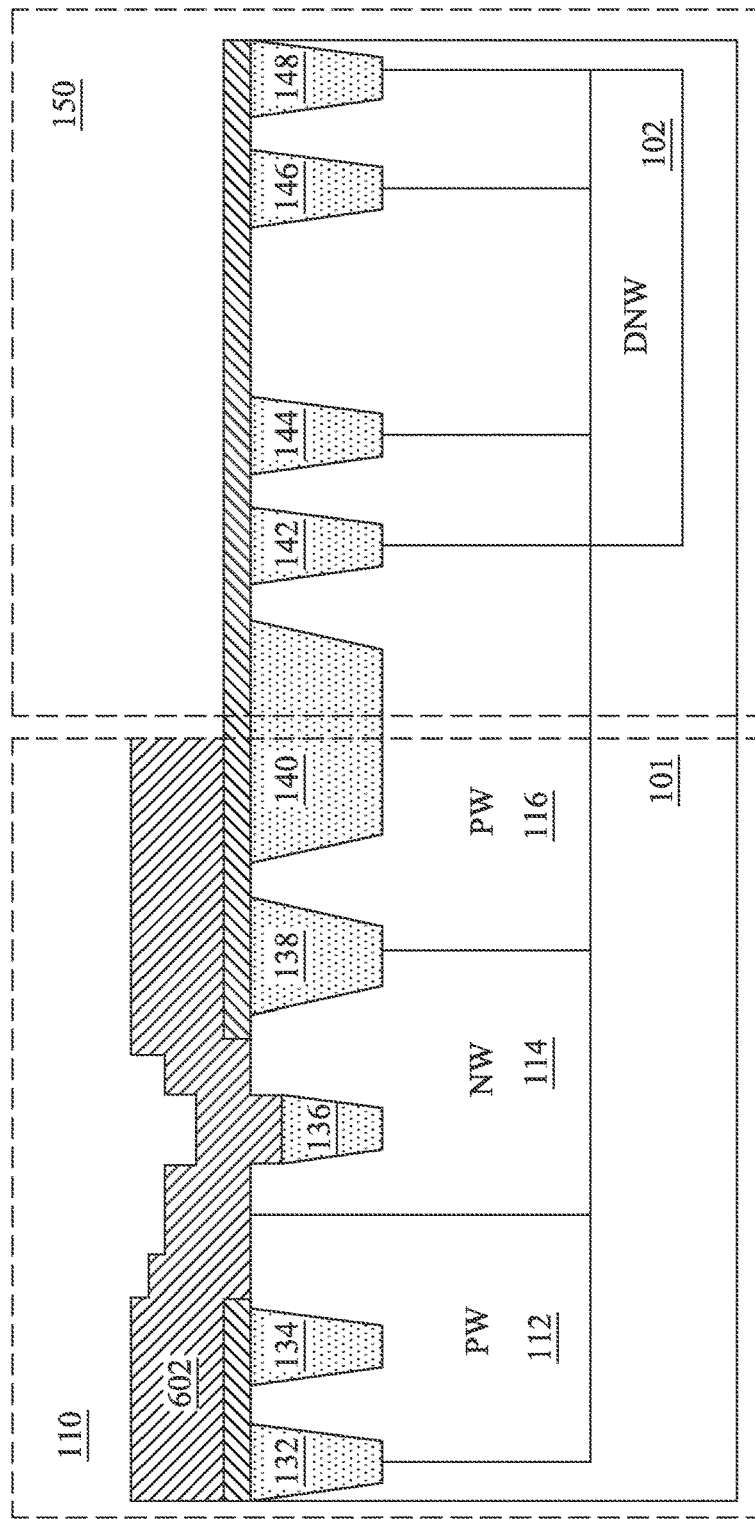
FIG. 8 illustrates a cross sectional view of the semiconductor device shown in FIG. 7 after an etching process is applied to the high voltage gate dielectric layer in accordance with an embodiment.

FIG. 8 illustrates a cross sectional view of the semiconductor device shown in FIG. 7 after an etching process is applied to the high voltage gate dielectric layer in accordance with an embodiment. An etching process is applied to the semiconductor device. As shown in FIG. 8, the portion of the high voltage gate dielectric layer 602 over the low voltage region 150 has been removed as a result.

Figure 9:
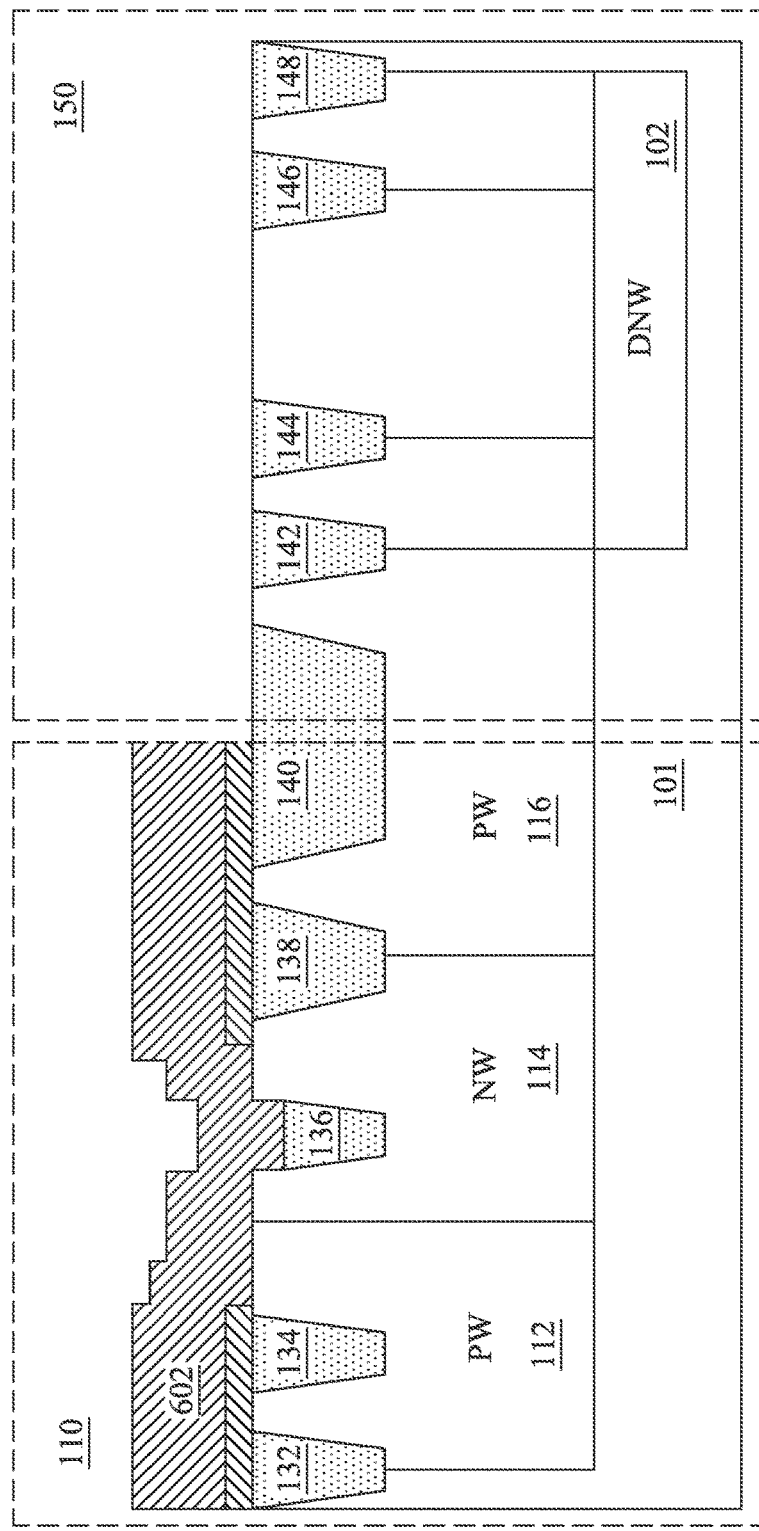
FIG. 9 illustrates a cross sectional view of the semiconductor device shown in FIG. 8 after an etching process is applied to the dielectric layer in accordance with an embodiment.

FIG. 9 illustrates a cross sectional view of the semiconductor device shown in FIG. 8 after an etching process is applied to the dielectric layer in accordance with an embodiment. An etching process is applied to the semiconductor device. As shown in FIG. 9, the portion of the dielectric layer 190 over the low voltage region 150 has been removed as a result.

Figure 10:
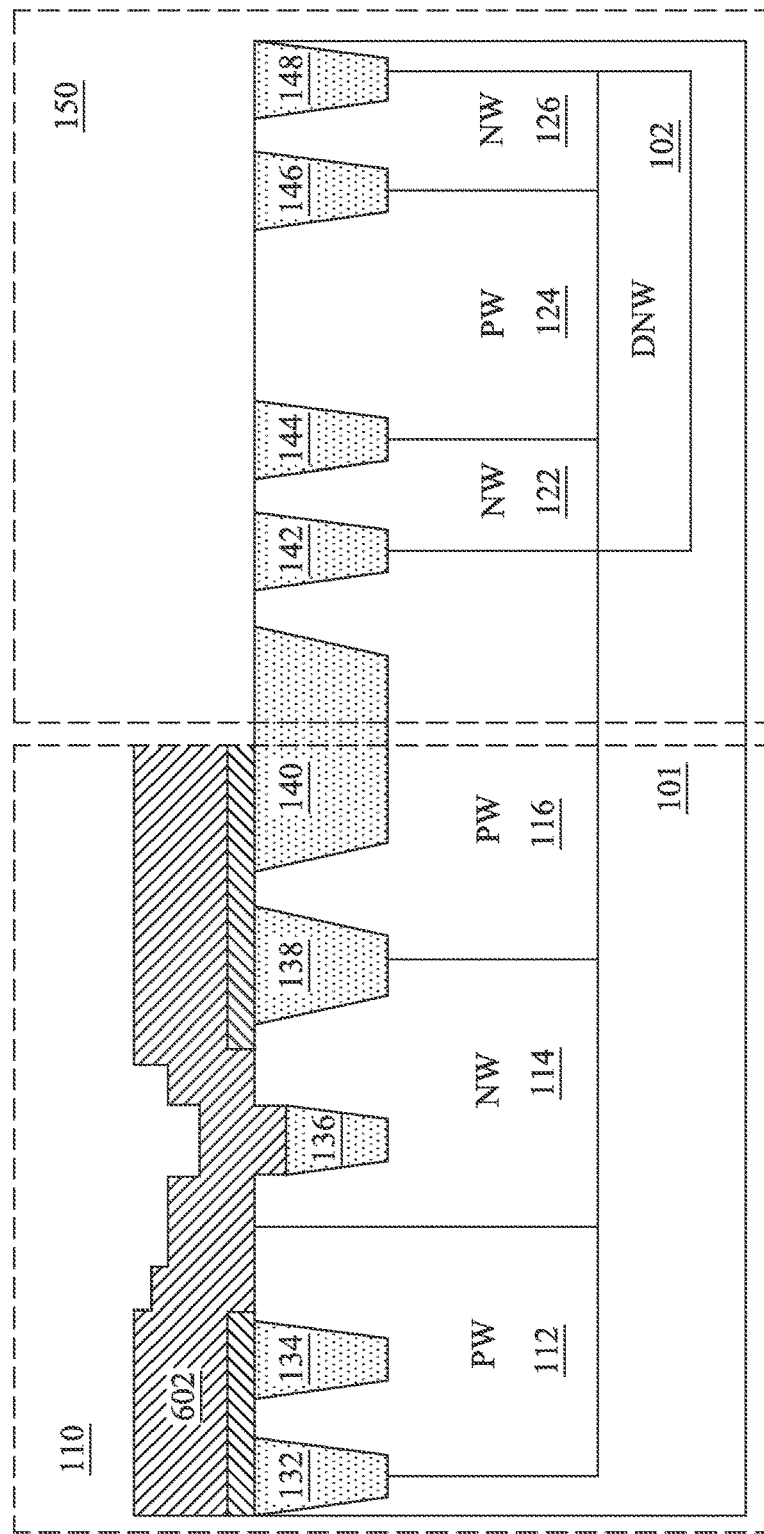
FIG. 10 illustrates a cross sectional view of the semiconductor device shown in FIG. 9 after low voltage wells are formed in the low voltage region over the substrate in accordance with an embodiment.

FIG. 10 illustrates a cross sectional view of the semiconductor device shown in FIG. 9 after low voltage wells are formed in the low voltage region over the substrate in accordance with an embodiment. Similar to the doping process shown in FIG. 2, the low voltage region 150 may be doped with various wells. As shown in FIG. 10, in the low voltage region 150, n-type wells 122, 126 and p-type well 124 are formed in a deep n-type well (DNW) 102, which is formed in the substrate 101.

Figure 11:
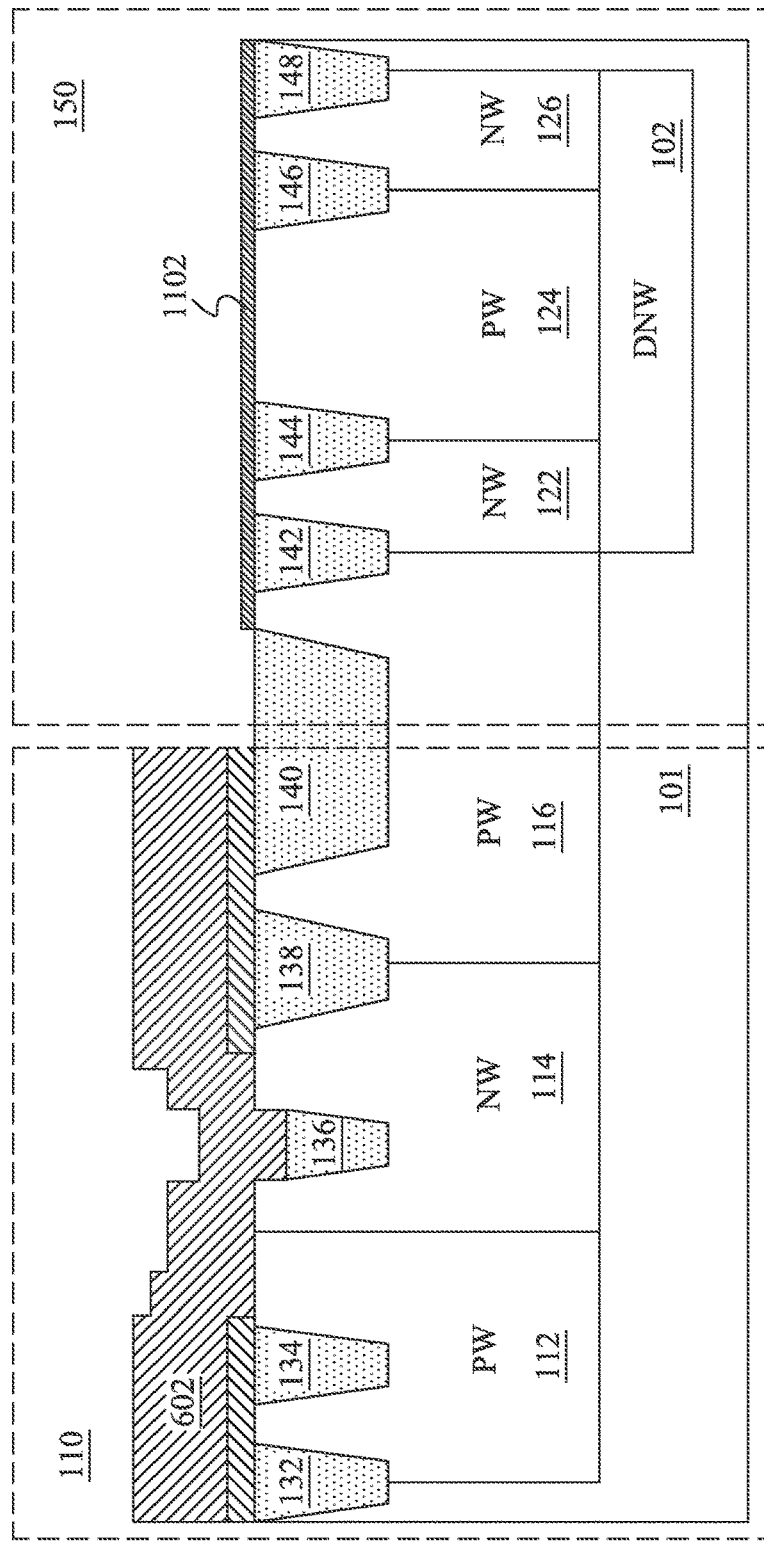
FIG. 11 illustrates a cross sectional view of the semiconductor device shown in FIG. 10 after a thin dielectric layer is formed over the low voltage region in accordance with an embodiment.

FIG. 11 illustrates a cross sectional view of the semiconductor device shown in FIG. 10 after a thin dielectric layer is formed over the low voltage region in accordance with an embodiment. The thin dielectric layer 1102 is a low voltage gate dielectric layer. The low voltage gate dielectric layer 1102 is formed by using suitable fabrication techniques such as, thermal oxidation and/or the like.

In accordance with an embodiment, the low voltage gate dielectric layer 1102 comprises an oxide, such as silicon oxide. Alternatively, the low voltage gate dielectric layer 1102 can comprise hafnium oxide, tantalum oxide, aluminum oxide, the like, or a combination thereof. The low voltage gate dielectric layer 1102 has a thickness in a range from about 15 Å to about 150 Å.

It should be noted while FIG. 11 shows the low voltage gate dielectric layer 1102 is a single layer, the low voltage gate dielectric layer 1102 can be of a multiple layer structure. Alternatively, the low voltage gate dielectric layer 1102 may comprise multiple dielectric materials. It should further be noted that the thickness of the high voltage gate dielectric layer 602 is greater than the thickness of the low voltage gate dielectric layer 1102.

Figure 12:
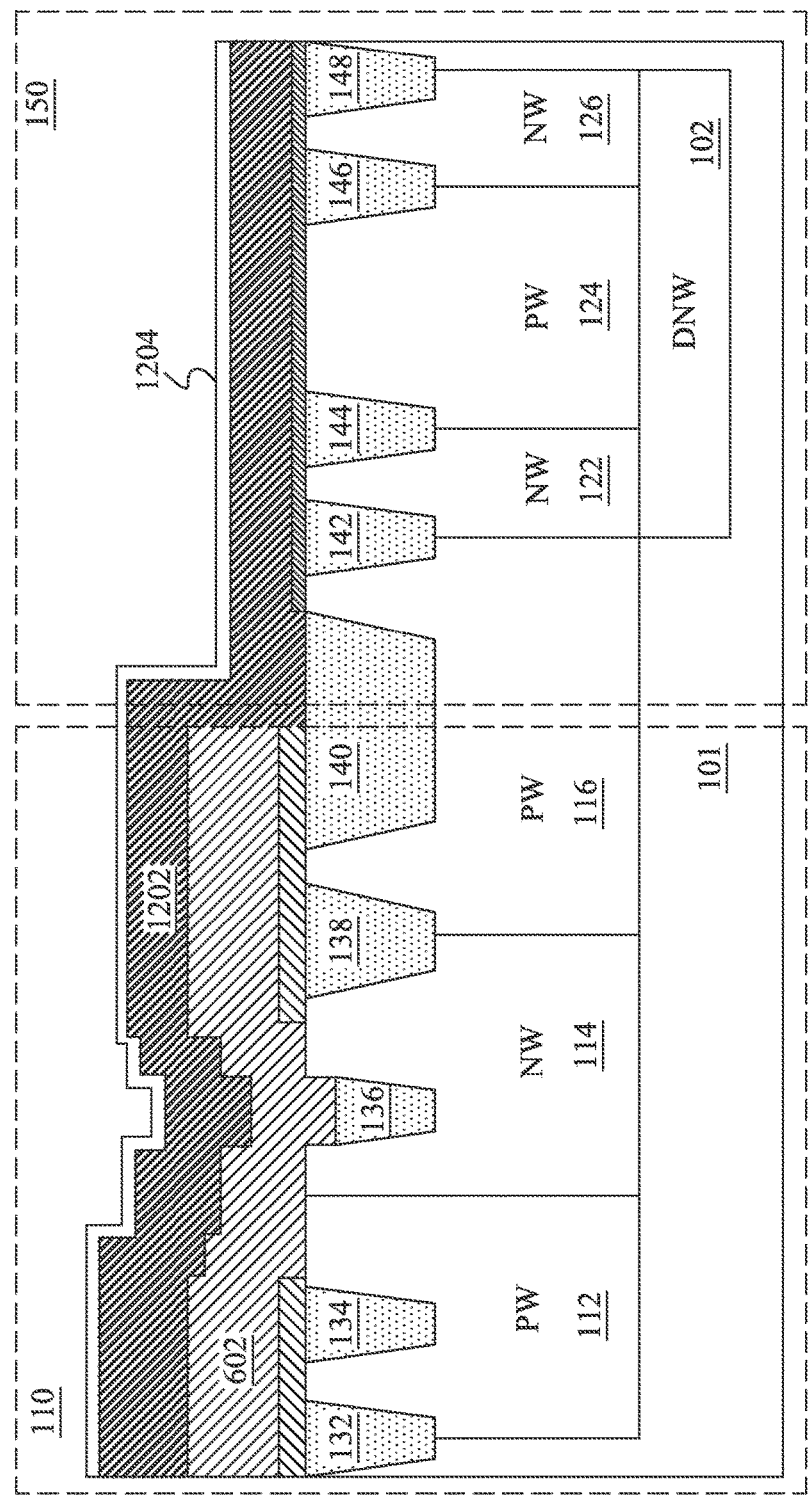
FIG. 12 illustrates a cross sectional view of the semiconductor device shown in FIG. 11 after a gate electrode layer is deposited over the substrate in accordance with an embodiment.

FIG. 12 illustrates a cross sectional view of the semiconductor device shown in FIG. 11 after a gate electrode layer is deposited over the substrate in accordance with an embodiment. The gate electrode layer 1202 may be formed of polysilicon. Alternatively, the gate electrode layer 1202 may be formed of other commonly used conductive materials such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like.

The gate electrode layer is deposited over the high voltage gate dielectric layer 602 and low voltage gate dielectric layer 1102 using suitable deposition techniques such as CVD and/or the like. The gate electrode layer 1202 can subsequently be used to form gate electrodes for transistor devices in the high voltage region 110 and transistor devices in the low voltage region 150.

A bottom anti-reflection coating (BARC) layer 1204 is formed over the gate electrode layer 1202. The BARC layer 1204 may be formed of a nitride material, an organic material, an oxide material and the like. The BARC layer 1204 may be formed using suitable techniques such as CVD and/or the like.

It should be noted that the gate electrode layer 1202 over the high voltage region 110 is of an uneven surface due to the uneven surface of the high voltage gate electric layer shown in FIG. 6.

Figure 13:
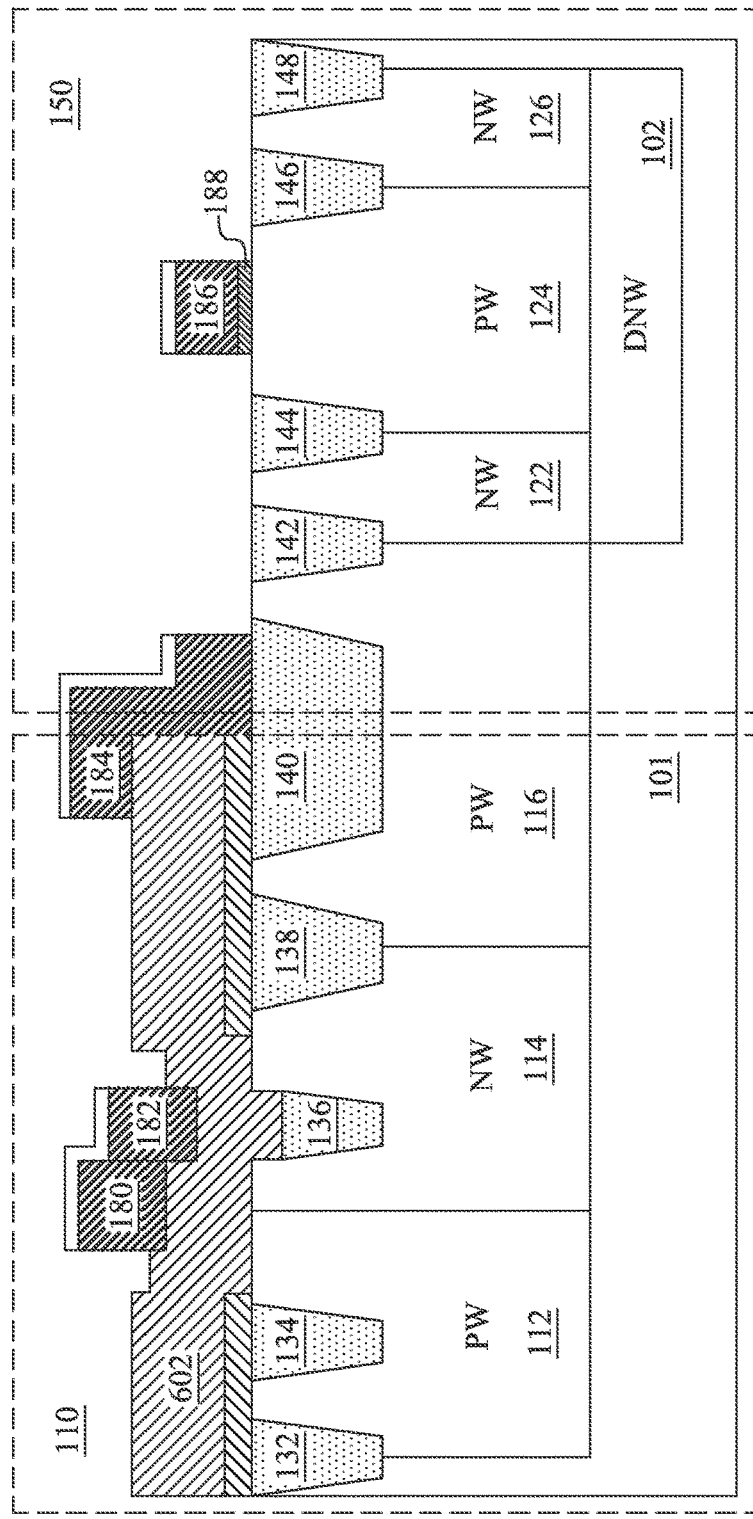
FIG. 13 illustrates a cross sectional view of the semiconductor device shown in FIG. 12 after an etching process is applied to the top surface of the semiconductor device in accordance with an embodiment.

FIG. 13 illustrates a cross sectional view of the semiconductor device shown in FIG. 12 after an etching process is applied to the top surface of the semiconductor device in accordance with an embodiment. The gate electrode layer 1202 is patterned to form a high voltage gate electrode layer including a first portion 180 and a second portion 182, a low voltage gate electrode 186 and a dummy structure 184 at a boundary between the high voltage region 110 and the low voltage region 150. The high voltage gate electrode is of an even surface. In particular, the top surface of the second portion 182 is lower than the top surface of the first portion 180. Such a lower top surface helps to prevent a short between the high voltage gate electrode and subsequently formed metal layers (not shown).

Figure 14:
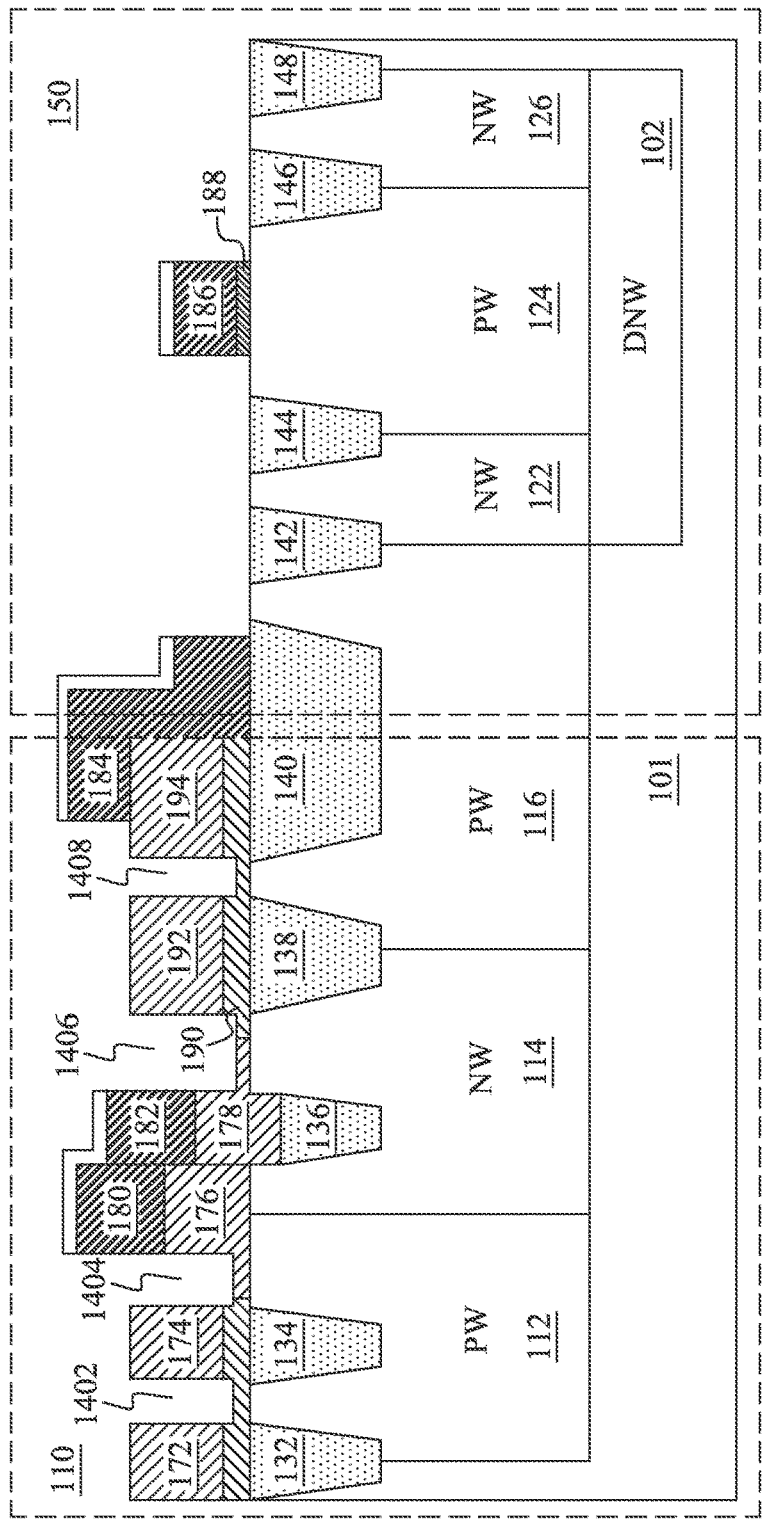
FIG. 14 illustrates a cross sectional view of the semiconductor device shown in FIG. 13 after an etching process is applied to the top surface of the semiconductor device in accordance with an embodiment.

FIG. 14 illustrates a cross sectional view of the semiconductor device shown in FIG. 13 after an etching process is applied to the top surface of the semiconductor device in accordance with an embodiment. The high voltage gate dielectric layer 602 may be patterned, such as by anisotropically etching to form the openings 1402, 1404, 1406 and 1408 as illustrated in FIG. 14.

Figure 15:
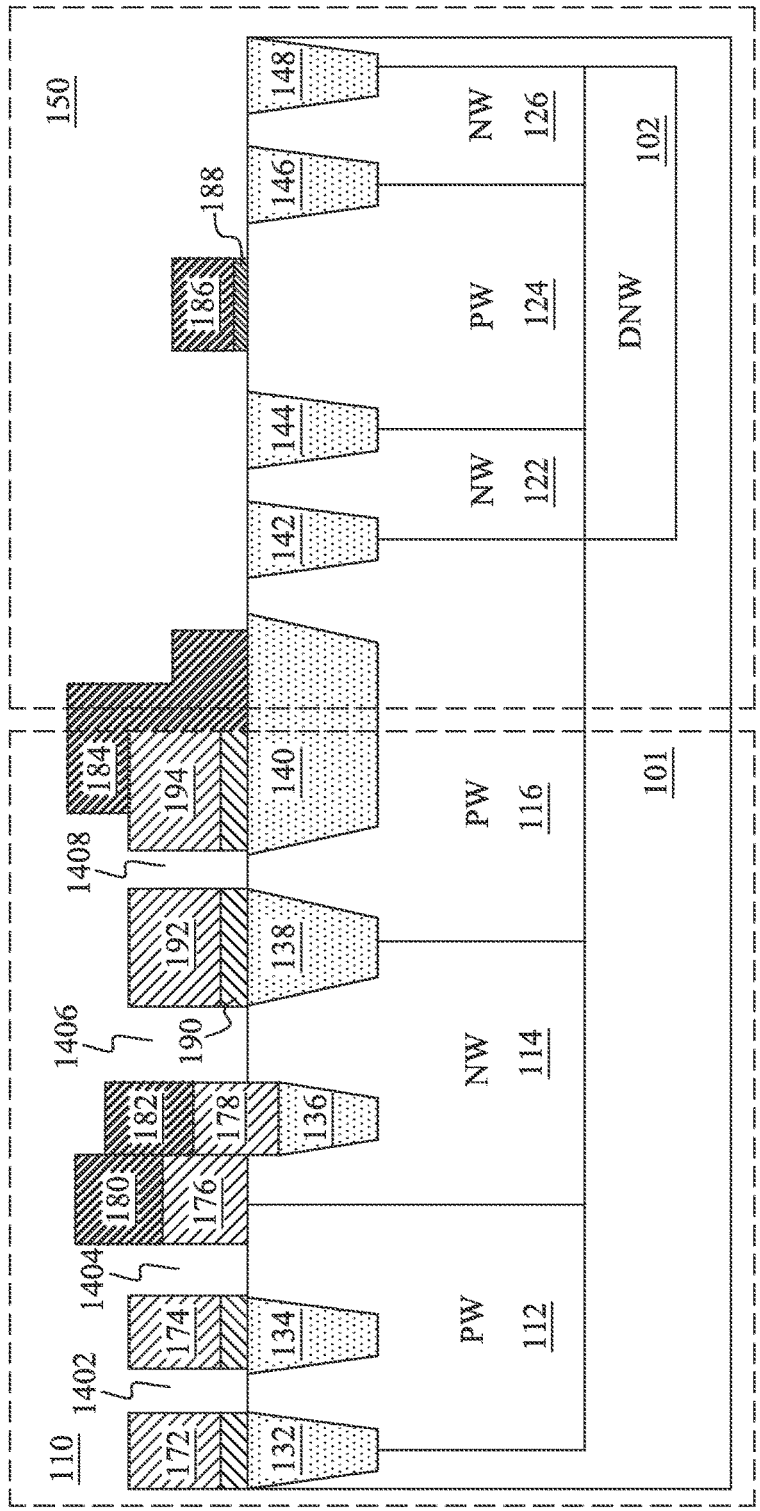
FIG. 15 illustrates a cross sectional view of the semiconductor device shown in FIG. 14 after an etching process is applied to the top surface of the semiconductor device in accordance with an embodiment.

FIG. 15 illustrates a cross sectional view of the semiconductor device shown in FIG. 14 after an etching process is applied to the top surface of the semiconductor device in accordance with an embodiment. In order to apply an ion implantation process to the high voltage region 110, an anisotropic etching process is applied to the openings 1402, 1404, 1406 and 1408 in accordance with an embodiment. As a result, the dielectric materials at the bottoms of the openings 1402, 1404, 1406 and 1408 have been removed.

A BARC removal process may be applied to the semiconductor device when the etching process is applied to the top surface of the semiconductor device. The BARC layer may be removed by using suitable etching techniques including dry etching, wet etching, a combination thereof and/or the like.

Figure 16:
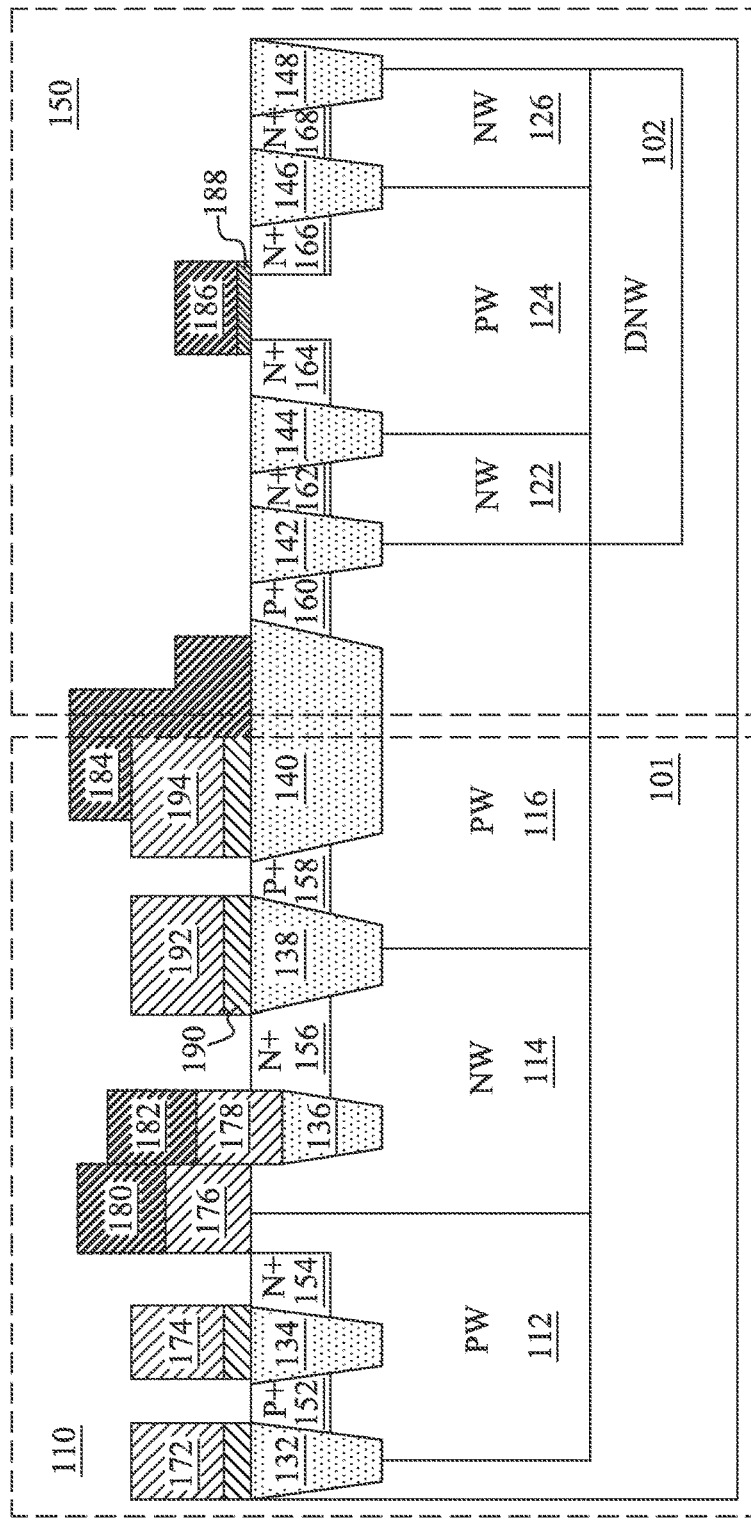
FIG. 16 illustrates a cross sectional view of the semiconductor device shown in FIG. 15 after high voltage drain/source regions and low voltage drain/source regions are formed in accordance with an embodiment.

FIG. 16 illustrates a cross sectional view of the semiconductor device shown in FIG. 15 after high voltage drain/source regions and low voltage drain/source regions are formed in accordance with an embodiment. In high voltage region 110, the drain/source regions 154 and 156 may be formed over the substrate 101 on opposing sides of the isolation region 136. The first P+ region 152 is formed between the isolation region 132 and isolation region 134. The second P+ region 158 is formed between the isolation region 138 and the isolation region 140.

In accordance with an embodiment, when the substrate 101 is an n-type substrate, the drain/source regions (e.g., drain/source region 154) may be formed by implanting appropriate p-type dopants such as boron, gallium, indium, or the like. Alternatively, in an embodiment in which the substrate 101 is a p-type substrate, the drain/source regions (e.g., drain/source region 154) may be formed by implanting appropriate n-type dopants such as phosphorus, arsenic, or the like. In accordance with an embodiment, the doping density of the drain/source regions (e.g., drain/source region 154) is in a range from about $10^{19}/cm^3$ to about $5 \times 10^{19}/cm^3$. It should be noted while FIG. 16 illustrates the drain/source regions are n-type, the drain/source regions may be p-type depending on different design needs.

In the low voltage region 150, the drain/source regions (e.g., N+ regions 164 and 166) may be formed over the substrate 101. In accordance with an embodiment, when the substrate 101 is an n-type substrate, the drain/source regions (e.g., drain/source region 164) may be formed by implanting appropriate p-type dopants such as boron, gallium, indium, or the like. Alternatively, in an embodiment in which the substrate 101 is a p-type substrate, the drain/source regions (e.g., drain/source region 164) may be formed by implanting appropriate n-type dopants such as phosphorus, arsenic, or the like. In accordance with an embodiment, the doping density of the drain/source regions (e.g., drain/source region 164) is in a range from about $10^{19}/cm^3$ to about $5 \times 10^{19}/cm^3$. It should be noted while FIG. 16 illustrates the low voltage drain/source regions are n-type, the low voltage drain/source regions may be p-type depending on different design needs.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
forming a first isolation region in a substrate, wherein a top surface of the first isolation region is level with a top surface of the substrate;
removing an upper portion of the first isolation region to form a recess;
depositing a gate dielectric layer over the first isolation region;
forming a gate electrode layer over the gate dielectric layer; and
patterning the gate electrode layer to form a gate electrode region, wherein:
a first portion of the gate electrode region is vertically aligned with the first isolation region; and
a second portion of the gate electrode region is formed over the substrate, and wherein a top surface of the first portion is lower than a top surface of the second portion.

2. The method of claim 1, further comprising:
depositing a dielectric layer on the top surface of the substrate, wherein the top surface of the first isolation region is covered by the dielectric layer;
patterning the dielectric layer to expose the top surface of the first isolation region; and
removing the upper portion of the first isolation region through an etching process.

3. The method of claim 2, wherein:
after removing the upper portion of the first isolation region through the etching process, a height of the recess is in a range from about 300 Angstroms to about 500 Angstroms.

4. The method of claim 2, further comprising:
patterning the gate dielectric layer to form a first opening and a second opening in the gate dielectric layer, wherein the first opening and the second opening are on opposite sides of the first isolation region.

5. The method of claim 4, further comprising:
after patterning the gate dielectric layer to form the first opening and the second opening, performing an etching process on the dielectric layer to remove the dielectric layer at bottoms of the first opening and the second opening to expose the top surface of the substrate.

6. The method of claim 5, further comprising:
after exposing the top surface of the substrate, forming a first drain/source region through a first ion implantation process, wherein an edge of the first drain/source region is vertically aligned with an edge of the first opening; and
forming a second drain/source region through a second ion implantation process, wherein an edge of the second drain/source region is vertically aligned with an edge of the second opening.

7. The method of claim 1, wherein:
the gate dielectric layer is conformally deposited over the substrate.

8. The method of claim 7, wherein:
the gate dielectric layer has an uneven surface.

9. A method comprising:
forming a plurality of isolation regions in a substrate, wherein a first isolation region is in a high voltage region of the substrate, a second isolation region and a third isolation region are in a low voltage region of the substrate, and a fourth isolation region is in both the high voltage region and the low voltage region of the substrate;
removing an upper portion of the first isolation region to form a trench;
depositing a high voltage gate dielectric layer over the substrate;
removing the high voltage gate dielectric layer over the low voltage region;
depositing a low voltage gate dielectric layer over the low voltage region;
depositing a gate electrode layer over the high voltage gate dielectric layer and the low voltage gate dielectric layer; and
patterning the gate electrode layer to form a first gate electrode region over the first isolation region, a second gate electrode region between the second isolation region and the third isolation region, and a third gate electrode region over the fourth isolation region, wherein a bottom surface of the first gate electrode region is higher than a bottom surface of the second gate electrode region.

10. The method of claim 9, wherein:
the third gate electrode region includes a first portion over the high voltage gate dielectric layer and a second portion in contact with the fourth isolation region, and wherein a bottom of the second portion of the third gate electrode region is lower than a bottom of the first portion of the third gate electrode region.

11. The method of claim 9, further comprising:
forming a fifth isolation region and a sixth isolation region in the high voltage region, wherein the fourth isolation region and the fifth isolation region are on opposite sides of the first isolation region.

12. The method of claim 11, further comprising:
forming a first drain/source region between the fifth isolation region and the first gate electrode region; and
forming a second drain/source region between the sixth isolation region and the first gate electrode region.

13. The method of claim 9, wherein:
the first gate electrode region includes a first portion formed over the first isolation region and a second portion formed over the substrate, and wherein a bottom of the first portion of the first gate electrode region is lower than a bottom of the second portion of the first gate electrode region.

14. The method of claim 9, wherein:
a portion of the high voltage gate dielectric layer is below a top surface of the substrate.

15. A method comprising:
forming a first isolation region in a high voltage region of a substrate and a second isolation region at a boundary between the high voltage region and a low voltage region, wherein a top surface of the first isolation region is level with a top surface of the second isolation region;

removing an upper portion of the first isolation region to form a recess;

depositing a gate dielectric layer over the first isolation region and the second isolation region;

forming a gate electrode layer over the gate dielectric layer; and patterning the gate electrode layer to form a first gate electrode region over the first isolation region and a second gate electrode region over the second isolation region wherein:

the first gate electrode region comprise a first portion over the first isolation region and a second portion over the substrate, and where a top surface of the first portion is lower than a top surface of the second portion.

16. The method of claim 15, further comprising:

forming a first drain/source region and a second drain/source region in the high voltage region, wherein the first drain/source region and the second drain/source region are on opposite sides of the first isolation region.

17. The method of claim 15, wherein:

the second gate electrode region includes a first portion over the high voltage region and a second portion over the low voltage region, and wherein a bottom of the second portion of the second gate electrode region is lower than a bottom of the first portion of the second gate electrode region.

18. The method of claim 15, wherein:

the second gate electrode region extends from a top surface of the gate dielectric layer to the top surface of the second isolation region.

19. The method of claim 15, further comprising:

patterning the gate electrode layer to form a third gate electrode region over the low voltage region, wherein a bottom of the third gate electrode region is lower than a bottom of the first gate electrode region.

20. The method of claim 19, further comprising:

forming a third drain/source region and a fourth drain/source region in the low voltage region, wherein the third drain/source region and the fourth drain/source region are on opposite sides of the third gate electrode region.

* * * * *